(12) United States Patent
Krishnan et al.

(10) Patent No.: US 7,939,380 B2
(45) Date of Patent: May 10, 2011

(54) METHOD OF MANUFACTURING A SEMICONDUCTOR COMPONENT WITH A LOW COST LEADFRAME USING A NON-METALLIC BASE STRUCTURE

(75) Inventors: Shutesh Krishnan, Negeri Sembilan (MY); Soon Wei Wang, Negeri Sembilan (MY); Jatinder Kumar, Jalandhar (IN)

(73) Assignee: Semiconductor Components Industries, LLC, Phoenix, AZ (US)

( * ) Notice: Subject to any disclaimer, the term of this patent is extended or adjusted under 35 U.S.C. 154(b) by 93 days.

(21) Appl. No.: 12/049,909

(22) Filed: Mar. 17, 2008

(65) Prior Publication Data
US 2009/0102028 A1    Apr. 23, 2009

(30) Foreign Application Priority Data
Oct. 23, 2007   (MY) ............................... PI 20071826

(51) Int. Cl.
*H01L 21/60*    (2006.01)
*H01L 21/56*    (2006.01)
*H01L 23/495*   (2006.01)

(52) U.S. Cl. ............. 438/123; 257/666; 257/E21.506; 257/E21.505; 257/E23.031; 438/124

(58) Field of Classification Search ........... 257/E21.505, 257/E21.506; 438/123, 124
See application file for complete search history.

(56) References Cited

U.S. PATENT DOCUMENTS

| 4,767,049 | A | | 8/1988 | Butt et al. | |
|---|---|---|---|---|---|
| 5,728,599 | A | | 3/1998 | Rostoker et al. | |
| 5,826,328 | A | | 10/1998 | Brady et al. | |
| 6,019,037 | A | * | 2/2000 | Larson | 428/189 |
| 2002/0076852 | A1 | * | 6/2002 | Paulus et al. | 438/110 |
| 2004/0084759 | A1 | * | 5/2004 | Miyagawa | 257/678 |
| 2005/0263864 | A1 | * | 12/2005 | Islam et al. | 257/676 |
| 2006/0292752 | A1 | * | 12/2006 | Connell et al. | 438/126 |
| 2007/0205492 | A1 | * | 9/2007 | Wang | 257/659 |
| 2008/0036099 | A1 | * | 2/2008 | Theuss et al. | 257/782 |

* cited by examiner

*Primary Examiner* — Marcos D Pizarro
*Assistant Examiner* — Raj Gupta
(74) *Attorney, Agent, or Firm* — Rennie William Dover

(57) ABSTRACT

A method for manufacturing a semiconductor component that includes a leadframe having a non-metallic base structure and an intermediate leadframe structure. The non-metallic base structure may be, among other things, paper, cellulose, or plastic. A layer of electrically conductive material is formed over the non-metallic base structure. A circuit element attach structure and a plurality of leadframe leads are formed from the layer of electrically conductive material. A circuit element is coupled to the circuit element attach structure and electrically coupled to the plurality of leadframe leads. The circuit element is encapsulated and at least the non-metallic base structure is removed. Alternatively, a plurality of leadframe leads may be formed on the electrically conductive layer and a circuit element is placed over the electrically conductive layer. The circuit element is electrically coupled to the plurality of leadframe leads and encapsulated. The non-metallic base structure and the electrically conductive layer are removed.

24 Claims, 9 Drawing Sheets

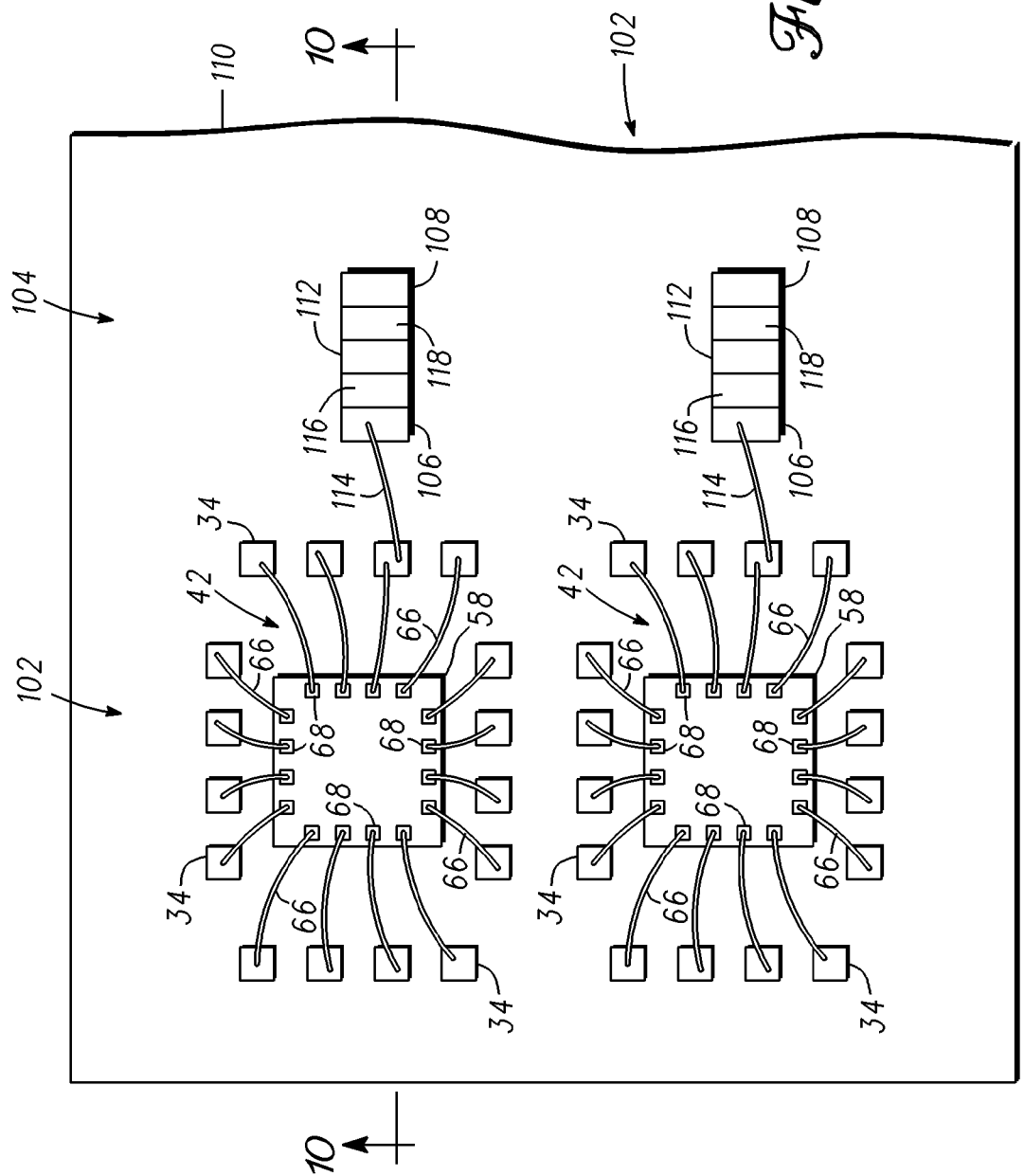

METHOD OF MANUFACTURING A SEMICONDUCTOR COMPONENT WITH A LOW COST LEADFRAME USING A NON-METALLIC BASE STRUCTURE

TECHNICAL FIELD

The present invention relates, in general, to a semiconductor component and, more particularly, to leadframes used in semiconductor components.

BACKGROUND

Semiconductor component manufacturers are constantly striving to increase the performance of their products while decreasing their cost of manufacture. A cost intensive area in the manufacture of semiconductor components is packaging the semiconductor chips that contain the semiconductor devices. As those skilled in the art are aware, discrete semiconductor devices and integrated circuits are fabricated from semiconductor wafers, which are then singulated or diced to produce semiconductor chips. Typically, one or more semiconductor chips is attached to a metal leadframe using a solder die attach material and encapsulated within a mold compound to provide protection from environmental and physical stresses.

After encapsulation of the semiconductor chips and singulation into semiconductor components, the portions of the leadframe that were used for support are discarded. Because most of the metal is used for providing support during the manufacturing steps, a large portion of the metal is discarded. Thus, one way to lower the cost of the semiconductor components is to use a low cost metal for the leadframe. However, the selection of the metal is strongly influenced by its mechanical properties and performance criteria such as the thermal and electrical conductivities of the metal. The metal that offers an acceptable trade-off between mechanical strength, thermal conductivity, and electrical conductivity is copper. A drawback with copper is that its price continues to increase, which increases the cost of the semiconductor components.

Accordingly, it would be advantageous to have a semiconductor component and a method for manufacturing the semiconductor component that includes a low cost leadframe.

BRIEF DESCRIPTION OF THE DRAWINGS

The present invention will be better understood from a reading of the following detailed description, taken in conjunction with the accompanying drawing figures, in which like reference characters designate like elements and in which:

FIG. 9 is a top view of a plurality of semiconductor components during manufacture in accordance with another embodiment of the present invention;

DETAILED DESCRIPTION

Figure 1:
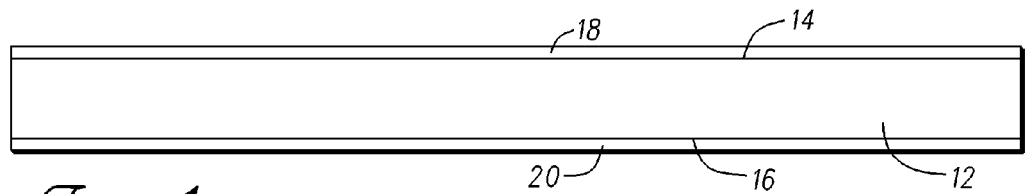
FIG. 1 is a cross-sectional view of a portion of a leadframe used in the manufacture of a semiconductor component in accordance with an embodiment of the present invention.

Generally the present invention provides a semiconductor component using a leadframe comprising a non-metallic substrate layer having a metallic layer on at least one surface of the non-metallic substrate. The non-metallic substrate is also referred to as a non-metallic base structure. In accordance with embodiments of the present invention, the leadframe used in the manufacture of semiconductor components comprises a low cost, non-metallic base structure between two layers of electrically conductive material. For example, the material of the non-metallic support structure may be cellulose, paper, plastic, or other materials capable of withstanding high temperature processing, the chemistries associated with forming electrically conductive layers, and the pressures associated with cutting or stamping metal layers. Suitable metals for the electrically conductive layers include copper, nickel, or the like. A circuit element attach structure and leadframe leads may be formed from one or more of the electrically conductive layers. The circuit element attach structure is also referred to as a semiconductor die attach pad or a circuit element attach pad when a semiconductor die is attached to it and as a passive device attach pad or a passive circuit element pad when a passive circuit element is attached to it. It should be noted that the circuit element attach structure, passive device attach pad, and leadframe leads are formed on the non-metallic substrate rather than being a portion of the non-metallic substrate. The semiconductor die is coupled to the circuit element attach structure and bond pads on the semiconductor die are coupled to the leadframe leads by wirebonds and encapsulated in an mold compound to form an intermediate structure. After protecting the semiconductor die and leadframe leads with the mold compound, the non-metallic base structure and at least one of the layers of electrically conductive material are removed.

In accordance with other embodiments of the present invention, leadframe leads are formed over one of the electrically conductive layers that is over the non-metallic base structure and a semiconductor die is attached to a portion of the electrically conductive material that is over the non-metallic base structure. The area over which the semiconductor die is attached is referred to as a semiconductor die attach area or a circuit element attach area. Bond pads on the semiconductor die are coupled to the leadframe leads by wirebonds. The semiconductor die, leadframe leads, and wirebonds are protected by an encapsulant or a mold compound to form an intermediate structure and the non-metallic support structure and the layers of electrically conductive material over the major surfaces of the non-metallic support structure are removed.

In accordance with other embodiments of the present invention, the leadframe comprising the low cost, electrically non-conductive material that is between two layers of electrically conductive material is used to make packages such as, for example, quad flat packages with or without leads, micro leadframe packages including micro leadframe quad and micro leadframe dual packages, dual-in-line packages, quad-in-line packages, or the like.

In accordance with other embodiments of the present invention, the leadframe comprises the non-metallic support structure into which the circuit element attach structure and leadframe leads are pressed. The non-metallic support structure may be cellulose, paper, plastic, or other materials capable of withstanding high temperature processing, the chemistries associated with forming electrically conductive layers, and the pressures associated with cutting or stamping metal layers. The circuit element attach structures may include, for example, electrically conductive pads, passive device pads, circuit element attach pads, or passive device attach pads. The circuit element attach structure is also referred to as a semiconductor die attach area or a semiconductor die attach region. Suitable metals for the electrically conductive layers include copper, nickel, or the like. The semiconductor dice are coupled to the electrically conductive layers and bond pads on the semiconductor dice are coupled to the leadframe leads by wirebonds. The semiconductor dice and leadframe leads are protected by a mold compound to form an intermediate structure and the non-metallic base structure is removed.

FIG. 1 is a cross-sectional view of a non-metallic support structure 12 used as a portion of a leadframe during the manufacture of a semiconductor component 10 (shown in FIG. 8) in accordance with an embodiment of the present invention. Preferably, non-metallic support structure 12 is comprised of a fibrous structure having a top surface 14, a bottom surface 16, and a thickness ranging from about 100 micrometers (μm) to about 2,500 μm. Surfaces 14 and 16 are also referred to as top and bottom surfaces, respectively. By way of example the fibrous structure is a cellulose-based material such as paper. Other suitable materials for non-metallic support structure 12 include cardboard, plastics, organic substrates, or the like. Non-metallic support structure 12 is also referred to as a non-metallic base structure. Surfaces 14 and 16 are treated with a surface active agent such as, for example, rosin, to form water repellent layers 18 and 20 on surfaces 14 and 16, respectively. Rosin is a water repellent material formed by treating a resin acid with fumaric acid. Preferably, the rosin is slightly acidic having a pH value between about 4 and about 6.5. The pH value of the rosin is not a limitation of the present invention. The rosin molecules in water repellent layers 18 and 20 are amphipathic and have opposing ends where one end is hydrophilic and the opposite end is hydrophobic. The hydrophilic ends face surfaces 14 and 16 and the hydrophobic ends extend away from surfaces 14 and 16. The hydrophobic ends of layers 18 and 20 repel water thereby reducing water absorption by non-metallic support structure 12. Forming layers 18 and 20 on non-metallic support structure 12 is referred to as sizing or hard sizing non-metallic support structure 12.

Figure 2:
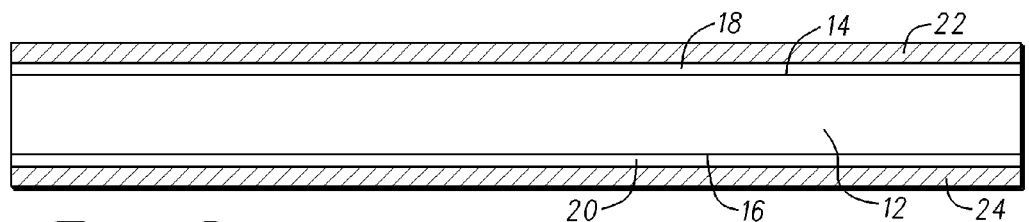
FIG. 2 is a cross-sectional view of the leadframe portion of FIG. 1 at a later stage of manufacture.

Referring to FIG. 2, a layer of conductive material 22 having a thickness ranging from about 20 μm to about 50 μm is formed on water repellent layer 18 and a layer of conductive material 24 having a thickness ranging from about 20 μm to about 50 μm is formed on water repellent layer 20. In accordance with an embodiment of the present invention, conductive layers 22 and 24 are a metal such as, for example, copper or nickel formed by an electroless copper plating technique or an electroless nickel plating technique. The copper may be plated onto water repellent layers 18 and 20 using a copper containing bath that includes copper (II) sulfate as a source of copper, formaldehyde as a chemical reducing agent, and a complexing or chelating agent to hold the copper in solution. Suitable complexing or chelating agents include tartrate ions, ethylene diamine tetraacetic acid (EDTA), amines, amine derivatives, glycolic acid, or the like. The pH of the bath is preferably maintained at a value greater than about eleven (11) because the reducing power of formaldehyde increases with pH. The bath for nickel plating is similar to that for copper plating except that the bath contains nickel in place of copper. The water-repellent property of layers 18 and 20 causes the surface of non-metallic support structure 12 to repel water in a chemical solution used during the plating process. This facilitates removal of the conductive material after a molding process.

Alternatively, electrically conductive layers 22 and 24 may be formed using a bronzing process or an electroplating process. Metals that can be used to form electrically conductive layers 22 and 24 include gold, silver, rhodium, chrome, zinc, tin, alloys thereof, or a metal matrix composite material.

Figure 3:
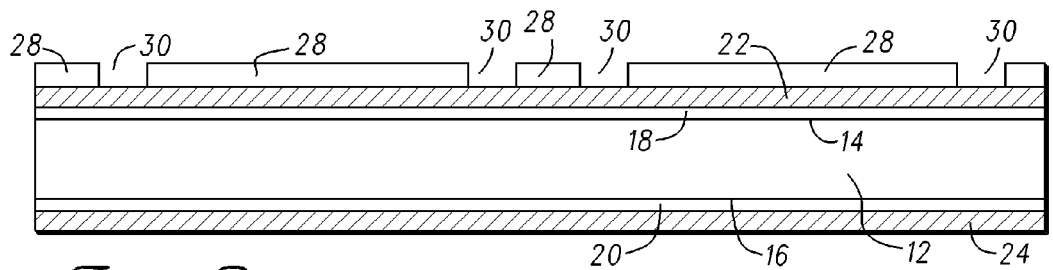
FIG. 3 is a cross-sectional view of the leadframe portion of FIG. 2 at a later stage of manufacture.

Referring now to FIG. 3, a layer of photoresist is formed on electrically conductive layer 22 and patterned to form a masking structure 28 having openings 30 that expose portions of electrically conductive layer 22.

Figure 4:
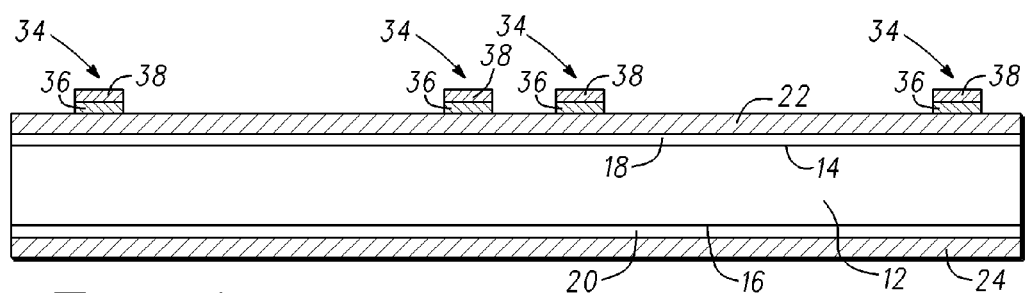
FIG. 4 is a cross-sectional view of the leadframe portion of FIG. 3 at a later stage of manufacture.

FIG. 4 is a cross-sectional view of leadframe leads 34 formed on the exposed portions of electrically conductive layer 22 using, for example, an electroplating technique. In accordance with an embodiment of the present invention, leadframe leads 34 comprise a two layer structure in which a second layer 38 of electrically conductive material is formed on a first layer 36 of electrically conductive material, which is formed on electrically conductive layer 22. The material for electrically conductive layer 36 may be gold or nickel having a thickness ranging from about 5 μm to about 25 μm and the material for electrically conductive layer 38 may be silver or nickel having a thickness ranging from about 0.2 μm to about 1 μm. By way of example, electrically conductive layer 36 is gold and the material for electrically conductive layer 38 is silver. After formation of leadframe leads 34, masking structure 28 is removed.

Figure 5:
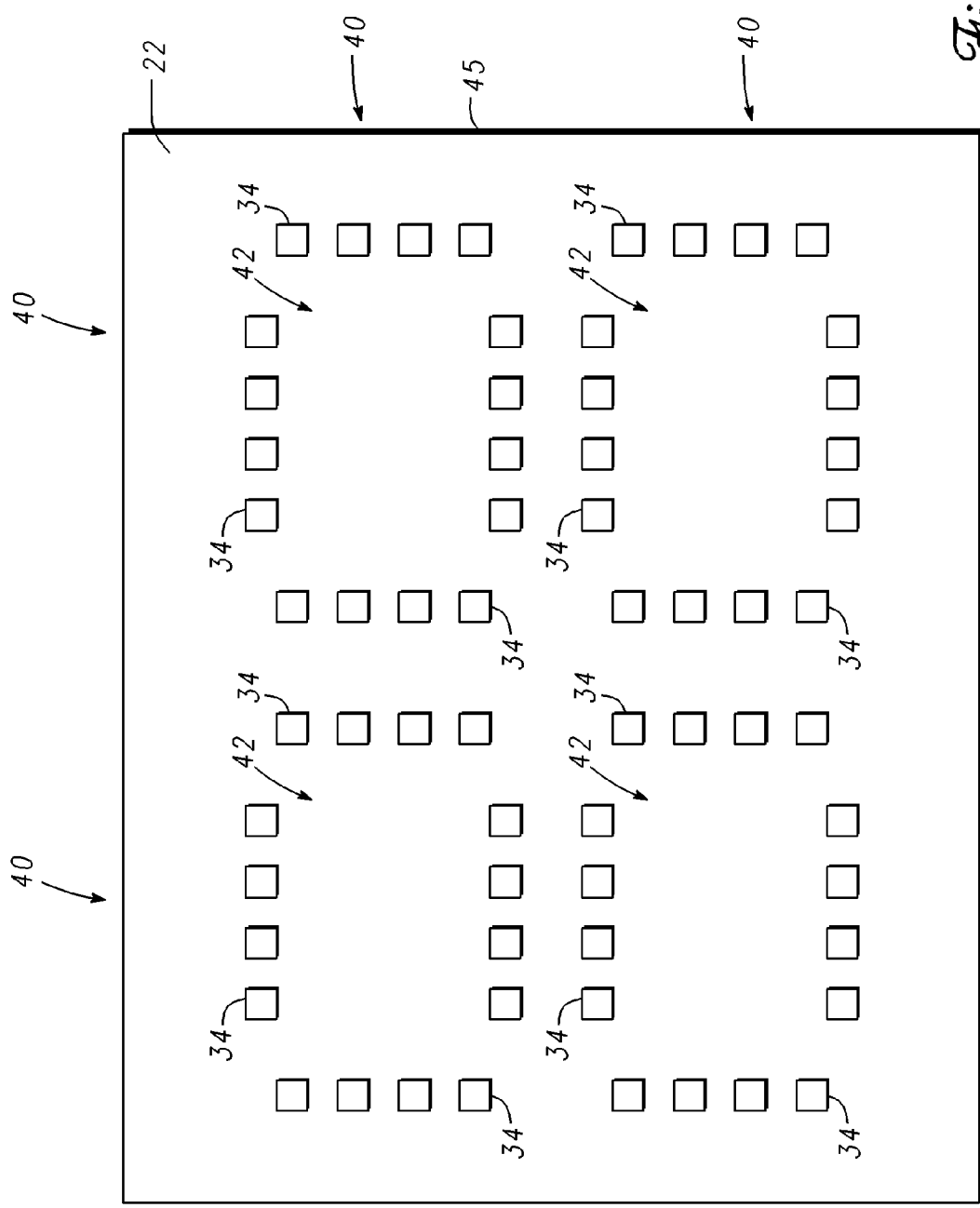
FIG. 5 is a top view of a leadframe including the leadframe portion of FIG. 4 at a later stage of manufacture.

FIG. 5 is a top view of electrically conductive layer 22 and leadframe leads 34. More particularly, FIG. 5 illustrates a plurality of semiconductor component sections 40 comprising a semiconductor die attach area 42 and leadframe leads 34. Semiconductor die attach area 42 is also referred to as a semiconductor die attach structure, a circuit element attach area, or a circuit element attach structure and leadframe leads 34 are also referred to as input/output pads. A semiconductor component 10 may be manufactured from each semiconductor component section 40. Non-metallic support structure 12, water repellent layers 18 and 20, electrically conductive layers 22 and 24, semiconductor die attach area 42, and leadframe leads 34 cooperate to form a leadframe 45. It should be noted that a leadframe typically comprises a plurality of semiconductor component sections arranged in an M×N peripheral array, where M is the number of rows in the array and N is the number of columns in the array. The numbers of rows and columns are not limitations of the present invention. What is shown in FIG. 5 is a 2×2 array of semiconductor component sections wherein two semiconductor component sections 40 are shown in each row and two semiconductor component sections 40 are shown in each column.

Figure 6:
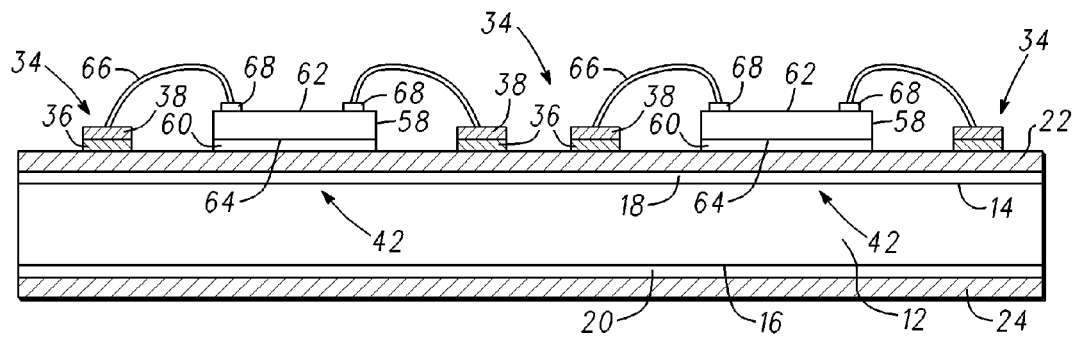
FIG. 6 is a cross-sectional view of a plurality of semiconductor components taken along section line 6-6 of FIG. 7.
Figure 7:
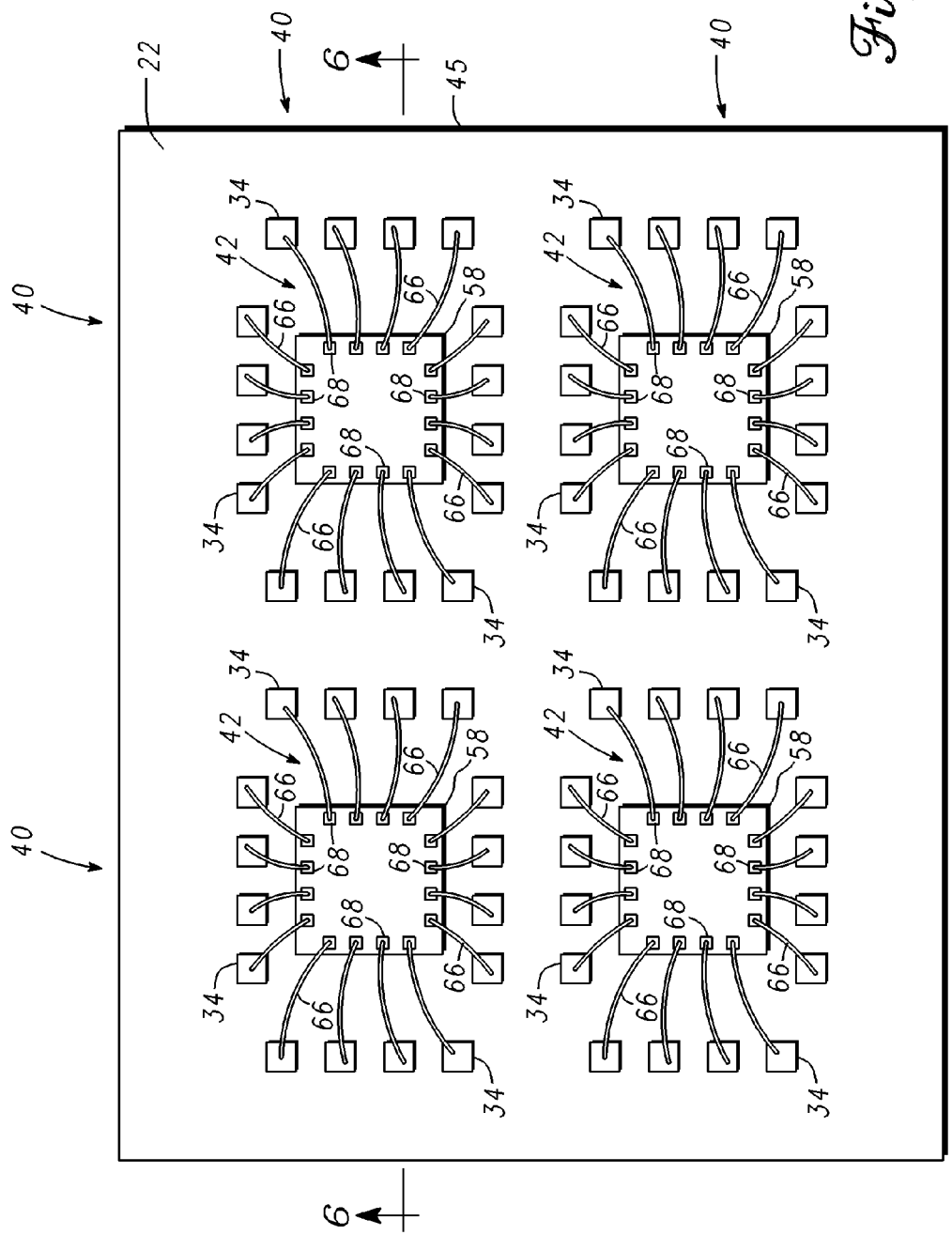
FIG. 7 is a top view of the plurality of semiconductor components of FIG. 6 in accordance with an embodiment of the present invention.

FIG. 6 is a cross-sectional view of leadframe 45 taken along section line 6-6 of FIG. 7. FIG. 6 illustrates a semiconductor dice 58 coupled to a semiconductor die attach areas 42 via a die attach material 60. Each semiconductor die 58 has a top or active surface 62 and a bottom or mating surface 64. A plurality of bond pads 68 is disposed on active surfaces 62. Mating surfaces 64 are placed in die attach material 60 which is disposed on semiconductor die attach areas 42. Suitable materials for die attach material 60 include epoxy, polyimide, a thermoplastic paste, a thermoplastic film, or the like. Die attach material 60 can be dispensed onto the surfaces of semiconductor die attach areas 42 or laminated to the back of semiconductor dice 58 and B-stage cured.

Wirebonds 66 connect bond pads 68 to corresponding leadframe leads 34. Wirebonds are also referred to as bond wires and interconnect wires. Preferably, a single wirebond connects a leadframe lead to a corresponding bond pad. However, this is not a limitation of the present invention. For example, one or more bond pads may be connected to a single leadframe lead. FIG. 7 is a top view of semiconductor dice 58 coupled to semiconductor die attach areas 42 and bond pads 68 coupled to leadframe leads 34 by wirebonds 66, respectively. Sixteen bond pads 68, sixteen leadframe leads 34, and sixteen wirebonds 66 have been shown and described for each semiconductor component section 40 in FIG. 7. However it should be understood that the number of bond pads 68, leadframe leads 34, and wirebonds 66 is not a limitation of the present invention. In addition, the shapes of leadframe leads 34 may be configured so that a plurality of bond pads 68 are coupled to a single leadframe lead 34 by wirebonds 66. Techniques for forming wirebonds are known to those skilled in the art. Although a single semiconductor die has been described as being attached to each semiconductor die attach area 42 of leadframe 45, this is not a limitation of the present invention. The leadframe may be configured so that a plurality of semiconductor dice may be attached to a semiconductor die attach area or there may be a plurality of semiconductor die attach areas where each semiconductor die attach area includes one or more semiconductor die.

As described with reference to FIG. 3, leadframe 45 typically includes a plurality of active areas from which semiconductor components are manufactured. After formation of the wirebonds, non-metallic support structure 12 on which semiconductor dice are mounted, leadframe leads 44, and wirebonds 66 are placed in a mold die for encapsulating semiconductor dice 58, leadframe leads 44 and wirebonds 66 with an encapsulant or a mold compound 70 that protects the semiconductor components from physical and environmental stresses.

Figure 8:
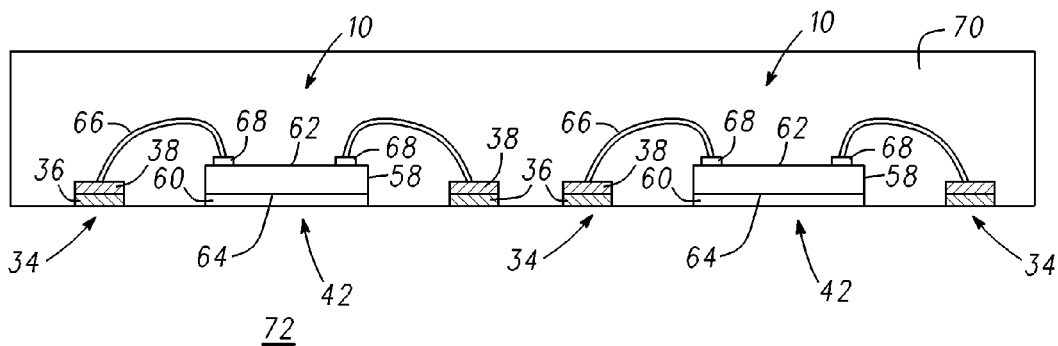
FIG. 8 is a cross-sectional view of a leadframe assembly that includes the leadframe portion of FIG. 6 at a later stage of manufacture.

FIG. 8 is a cross-sectional view of semiconductor die attach areas 42, semiconductor dice 58, leadframe leads 44 encapsulated by mold compound 70 which form a leadframe assembly 72. Electrically conductive layer 24, water repellant layer 20, non-metallic support structure 12, and water repellant layer 18 are removed using for example, a wafer planarization technique such as a chemical-mechanical planarization technique to expose electrically conductive layer 22, which is removed using, for example, a chemical-mechanical planarization technique, a wet etching technique, combinations thereof, or the like. Removing electrically conductive layer 22 leaves the copper under semiconductor die 58 in semiconductor die attach area 42 spaced apart or electrically isolated from leadframe leads 34 by mold compound 70. The individual semiconductor components 10 are then singulated from leadframe assembly 72. Leadframe assembly 72 shown in FIG. 8 has two semiconductor components 10 such that it can be singulated into two individual semiconductor components. It should be noted that the present invention is not limited to having a single semiconductor die coupled to semiconductor die attach areas 42 and that passive as well as active devices may be attached to semiconductor die attach areas 42.

FIG. 9 is a top view of non-metallic support structure 12 used as a portion of a leadframe during the manufacture of a semiconductor component 100 (shown in FIG. 10) in accordance with another embodiment of the present invention. What is shown in FIG. 9 is a plurality of semiconductor component sections 102 comprising a semiconductor die attach area 42 and leadframe leads 34. In addition, semiconductor component sections 102 include passive device attach areas 104, which have leadframe leads 106 and 108 that may be manufactured when leadframe leads 34 are manufactured. A semiconductor component 100 may be manufactured from each semiconductor component section 102. Non-metallic support structure 12, water repellent layers 18 and 20, electrically conductive layers 22 and 24, leadframe leads 34, semiconductor die attach area 42, passive device attach area 104, and leadframe leads 106 and 108 cooperate to form a leadframe 110.

Semiconductor die 58 is coupled to semiconductor die attach area 42 and bond pads 68 are coupled to corresponding leadframe leads 34 by wirebonds 66. A passive device or passive circuit element 112 is coupled to leadframe leads 106 and 108 in passive device attach area 104. More particularly, contact terminals 116 and 118 of passive device 112 are coupled to leadframe leads 106 and 108 using for example, solder. Passive devices 112 cover portions of leadframe leads 106 and 108. Leadframe lead 106 may be coupled to one or more of leadframe leads 34 via wirebonds such as wirebond 114. Leadframe lead 108 may also be coupled to one or more of leadframe leads 34 or they may be coupled for receiving an electrical signal from a source external to semiconductor component 100. It should be understood that passive device or passive circuit element 112 may be an inductor, a resistor, a capacitor, or combinations thereof. More than two leadframe leads may be formed in passive device attach area 104 so that a plurality of passive devices may be manufactured from passive device attach area 104. Alternatively, a plurality of passive device attach areas such as area 104 may be manufactured as a portion of the leadframe.

Figure 10:
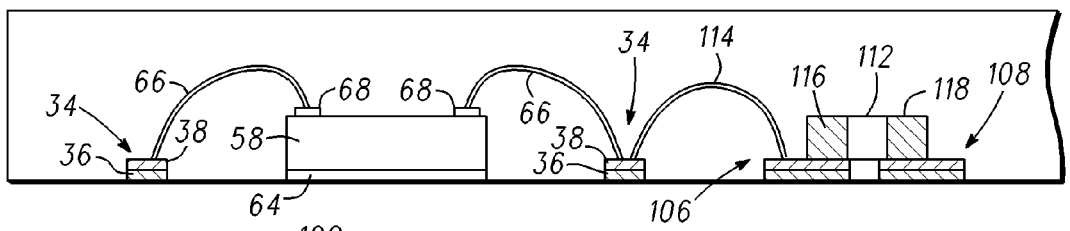
FIG. 10 is a cross-sectional view of a singulated semiconductor component of FIG. 9 at a later stage of manufacture.

FIG. 10 is a cross-sectional view of semiconductor component 100 after singulation. What is shown in FIG. 10 is a semiconductor die 58 and a passive circuit element 112 coupled to each other and encapsulated within an encapsulating material or mold compound 70. Bond pads 68 are coupled to corresponding leadframe leads 34 by wirebonds 66. Contact terminals 116 and 118 of passive circuit element 112 are coupled to leadframe leads 106 and 108, respectively, wherein leadframe lead 106 is coupled to a leadframe lead 34 by a wirebond 114. Thus, semiconductor component 100 comprises passive circuit element 112 electrically connected to semiconductor die 58.

Figure 11:
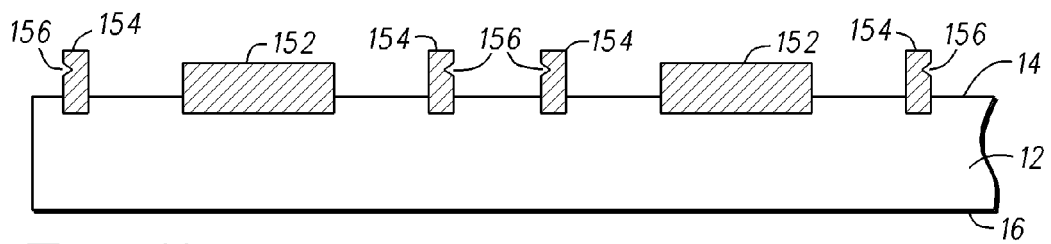
FIG. 11 is a cross-sectional view of a leadframe used in the manufacture of a semiconductor component in accordance with another embodiment of the present invention.

FIG. 11 is a cross-sectional view of non-metallic support structure 12 used as a portion of a leadframe during the manufacture of a semiconductor component 150 (shown in FIG. 14) in accordance with another embodiment of the present invention. Non-metallic support structure 12 has been described with reference to FIG. 1. It should be noted that treating surfaces 14 and 16 with a surface active agent such as rosin is an optional step. In accordance with the embodiment described with respect to FIG. 11, surfaces 14 and 16 preferably are not treated with the surface active agent. A circuit element attach structure or electrically conductive die attach pad 152 is pressed into non-metallic support structure 12 and electrically conductive leadframe leads 154 are pressed into portions of non-metallic support structure 12 that are adjacent to electrically conductive die attach pad 152. Circuit element attach structure 152 is also referred to as an electrically conductive die attach pad, a semiconductor die attach area, a semiconductor die attach pad, or a semiconductor die attach structure. Electrically conductive die attach pad 152 and leadframe leads 154 can be pressed into non-metallic support structure 12 using a stamping technique, a punching technique, application of constant pressure to electrically conductive die attach pads 152 and leadframe leads 154, or the like. The distance electrically conductive die attach pads 152 and leadframe leads 154 are pressed into non-metallic support structure 12 is defined by their thicknesses and the desired heights of their top surfaces above surface 14 of non-metallic support structure 12. Leadframe leads 154 have grooves or nicks 156 that serve as mold lock features. It should be noted that the presence of mold lock features is optional. Alternatively, holes or openings can be formed in non-metallic support structure 12 that are sized to accept electrically conductive die attach pads 152 and leadframe leads 154. An adhesive material may be placed in the openings and electrically conductive die attach pads 152 and leadframe leads 154 may be placed in their corresponding holes followed by setting or curing the adhesive material. Alternatively, electrically conductive die attach pads 152 and leadframe leads 154 may be attached to non-metallic support structure 12 by an adhesive tape or the openings may be sized so that electrically conductive die attach pads 152 and leadframe leads 154 remain in the openings by a friction fit.

In accordance with embodiments of the present invention, electrically conductive die attach pad 152 has a cuboid shape with side lengths of about 1,800 μm and a thickness of about 200 μm. It should be noted that the shape or pattern of the top surface of electrically conductive die attach pad 152 is not a limitation of the present invention. For example, it may have a triangular shape, a rectangular shape, a pentagonal shape, a polygonal shape, a circular shape, an elliptical shape, or the like. In addition, the dimensions of electrically conductive die attach pads 152 are not limitations of the present invention. Similarly, leadframe leads 154 may have a cuboid shape and their top surfaces may have a triangular shape, a rectangular shape, a pentagonal shape, a polygonal shape, a circular shape, an elliptical shape, or the like. By way of example, the side lengths of leadframe leads 154 are about 150 μm and the thicknesses of leadframe leads 154 are about 200 μm.

Figure 12:
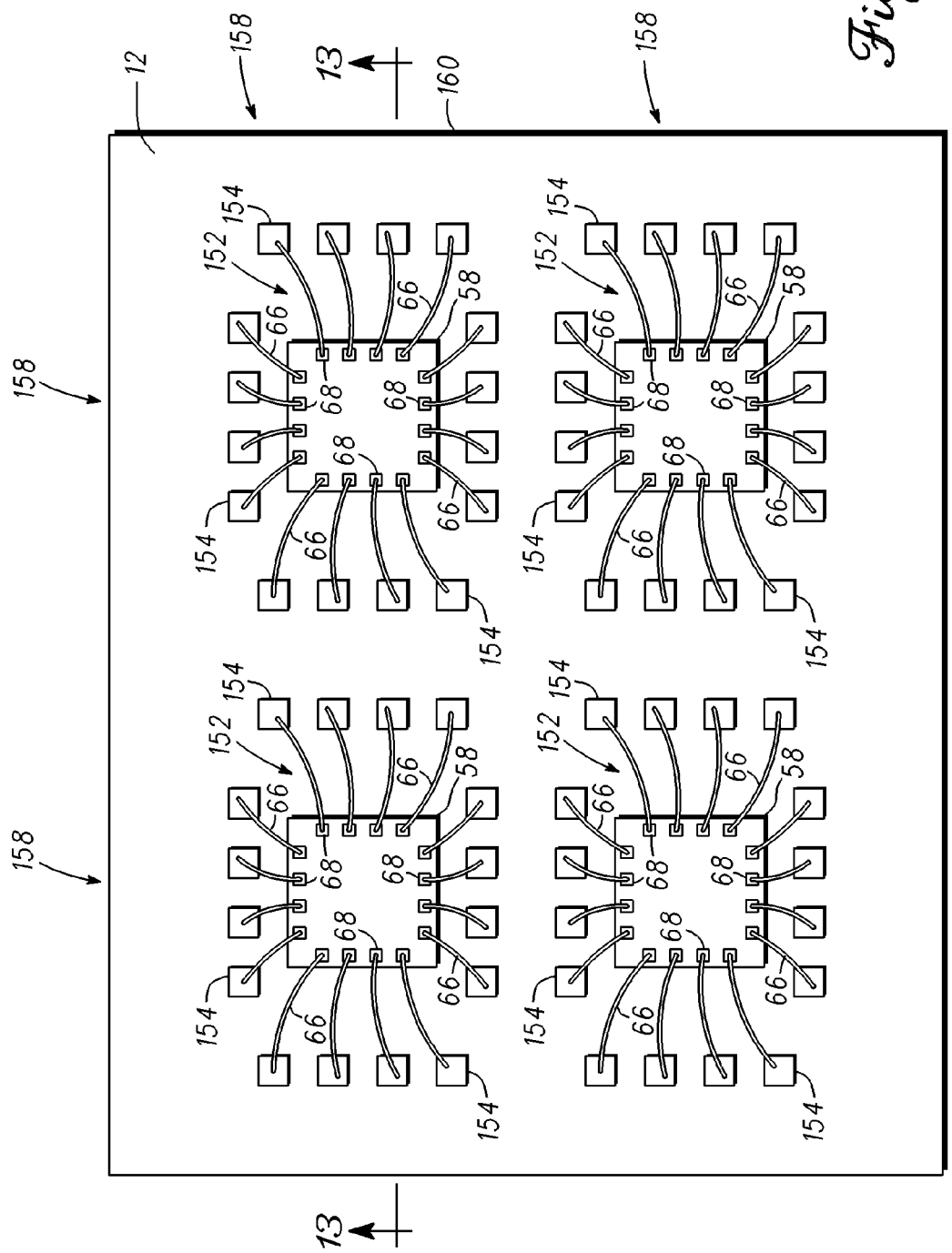
FIG. 12 is a top view of a plurality of semiconductor components during manufacture in accordance with another embodiment of the present invention wherein the semiconductor components include the leadframe of FIG. 11.

FIG. 12 is a top view of non-metallic support structure 12 in which electrically conductive layer 152 and leadframe leads 154 are embedded. More particularly, FIG. 12 illustrates a plurality of semiconductor component sections 158 comprising semiconductor die attach pads 152 and leadframe leads 154. A semiconductor component 150 may be manufactured from each semiconductor component section 158. Non-metallic support structure 12, electrically conductive die attach pad 152, and leadframe leads 154 cooperate to form a leadframe 160. What is shown in FIG. 12 is a 2×2 peripheral array of semiconductor component sections 158. A semiconductor die 58 is coupled to electrically conductive die attach pad 152 via a die attach material 60 shown in FIG. 13. Semiconductor die 58 and die attach material 60 have been described with reference to FIG. 5.

Wirebonds 66 connect bond pads 68 to corresponding leadframe leads 154. Preferably, a single wirebond connects a leadframe lead to a corresponding bond pad. However, this is not a limitation of the present invention. For example, one or more bond pads may be connected to a single leadframe lead. In accordance with the embodiment shown in FIG. 12, a semiconductor chip 58 is coupled to each semiconductor die attach area 152 and bond pads 68 are coupled to corresponding leadframe leads 154 by wirebonds 66. Although sixteen leadframe leads 154, sixteen wirebonds 66, and sixteen bond pads 68 have been shown and described with reference to FIG. 12, it should be understood that the number of leadframe leads 154, wirebonds 66, and bond pads 68 is not a limitation of the present invention. A single semiconductor die has been described as being attached to leadframe 160, however this is not a limitation of the present invention. The leadframe may be configured so that a plurality of semiconductor dice may be attached to a semiconductor die attach pad or a plurality of semiconductor die attach pads where each semiconductor die attach pad includes one or more semiconductor die.

Figure 13:
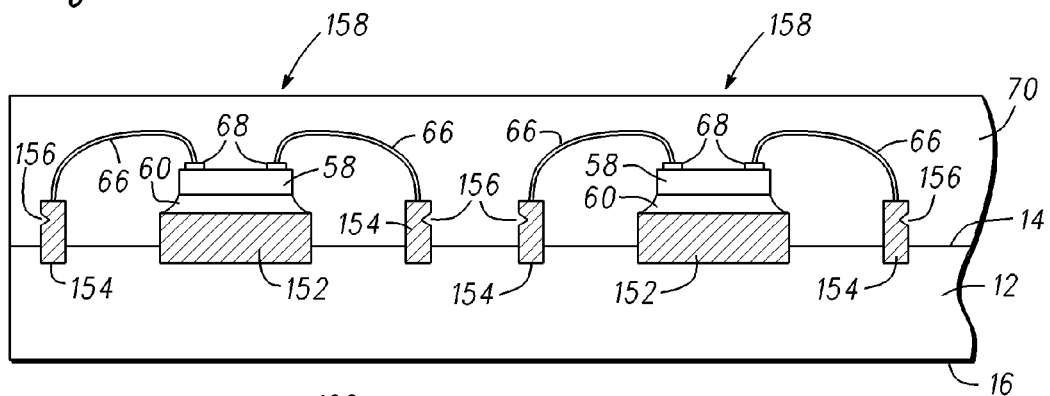
FIG. 13 is a cross-sectional view of a leadframe assembly that includes the leadframe of FIG. 11 at a later stage of manufacture.

FIG. 13 is a cross-sectional view of leadframe 160 taken along section line 13-13 of FIG. 12. FIG. 13 illustrates a semiconductor die 58 coupled to electrically conductive layer 152 via a die attach material 60 and wirebonds 66 connecting bond pads 68 to corresponding leadframe leads 154. Leadframe 160 is placed in a mold die (not shown) and a mold compound is injected into the mold die to form an encapsulant 70 over semiconductor die 58, wirebonds 66, electrically conductive die attach pads 152, and leadframe leads 154 to form a leadframe assembly 162. Mold compound 70 protects semiconductor dice 58, wirebonds 66, electrically conductive die attach pads 152, and leadframe leads 154 from physical and environmental stresses.

Figure 14:
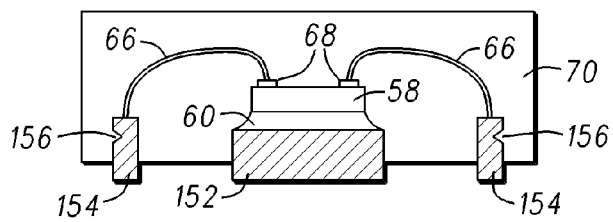
FIG. 14 is a cross-sectional view of a singulated semiconductor component of FIG. 13 at a later stage of manufacture.

Referring now to FIG. 14, non-metallic support structure 12 is removed from leadframe assembly 162 and the remaining portion of leadframe assembly 162 is singulated to form a plurality of semiconductor components 150. A single semiconductor component 150 is shown in FIG. 14.

Figure 15:
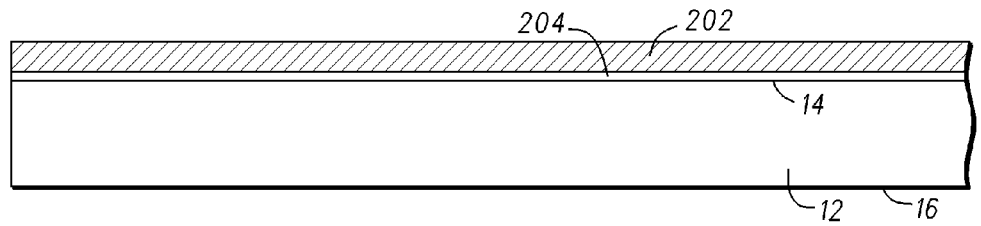
FIG. 15 is a cross-sectional view of a leadframe used in the manufacture of a semiconductor component in accordance with another embodiment of the present invention.

FIG. 15 is a cross-sectional view of a non-metallic support structure 12 used as a portion of a leadframe during the manufacture of a semiconductor component 200 (shown in FIG. 19) in accordance with another embodiment of the present invention. Non-metallic support structure 12 has been described with reference to FIG. 1. It should be noted that treating surfaces 14 and 16 with a surface active agent such as rosin is an optional step. In accordance with the embodiments described with respect to FIG. 15, surfaces 14 and 16 preferably are not treated with the surface active agent. A layer of electrically conductive material 202 having a thickness ranging from about 50 μm to about 100 μm is laminated onto surface 14 of non-metallic support structure 12 using an adhesive material 204. Suitable materials for electrically conductive layer 202 include copper, aluminum, gold, or the like. Suitable adhesive materials 204 include epoxies, silane activated adhesives, or the like. It should be noted that electrically conductive material 202 can also be laminated using high pressure lamination in combination with heat.

Figure 16:
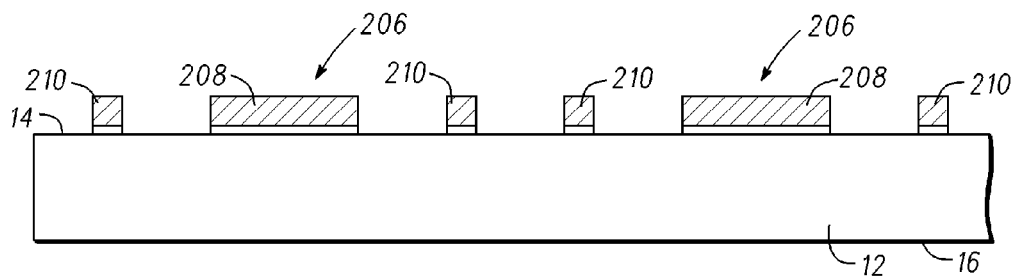
FIG. 16 is a cross-sectional view of the leadframe of FIG. 16 at a later stage of manufacture.

Referring now to FIG. 16, semiconductor component sections 206 that include electrically conductive die attach pads 208 and leadframe leads 210 are formed from electrically conductive layer 202. In accordance with an embodiment of the present invention, electrically conductive die attach pads 208 and leadframe leads 210 are formed using a photolithographic technique such as described with reference to FIGS. 3-5. Alternatively, electrically conductive die attach pads 208 and leadframe leads 210 can be formed using a laser cutting technique or a stamping technique followed by removal of the portions a electrically conductive layer 202 to electrically isolate electrically conductive die attach pads 208 and leadframe leads 210 from each other.

Figure 17:
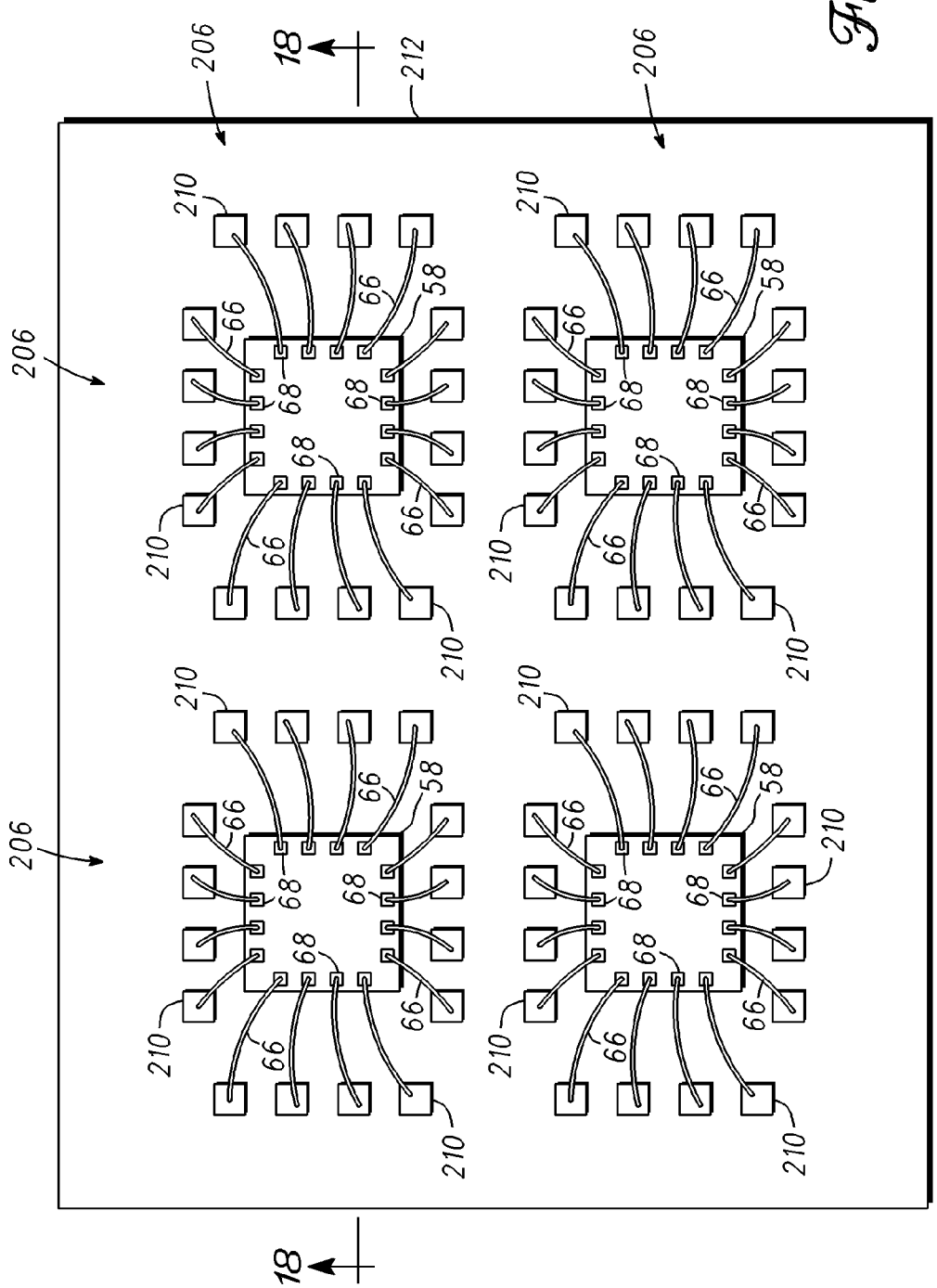
FIG. 17 is a top view of a plurality of semiconductor components during manufacture in accordance with another embodiment of the present invention wherein the semiconductor components include the leadframe of FIG. 16.

FIG. 17 is a top view of non-metallic support structure 12 on which electrically conductive die attach pads 208 and leadframe leads 210 are formed. More particularly, FIG. 17 illustrates a plurality of semiconductor component sections 206 comprising electrically conductive die attach pads 208 and leadframe leads 210. A semiconductor component 200 may be manufactured from each semiconductor component section 206. Non-metallic support structure 12, electrically conductive die attach pads 208, and leadframe leads 210 cooperate to form a leadframe 212. What is shown in FIG. 17 is a 2×2 peripheral array of semiconductor component sections 206. Semiconductor dice 58 are coupled to corresponding electrically conductive die attach pads 208 via a die attach material (not shown). Semiconductor dice 58 and the die attach material have been described with reference to FIG. 5. Wirebonds 66 connect bond pads 68 to corresponding leadframe leads 210. Preferably, a single wirebond connects a leadframe lead to a corresponding bond pad. However, this is not a limitation of the present invention. For example, one or more bond pads may be connected to a single leadframe lead. In accordance with the embodiment shown in FIG. 17, electrically conductive die attach pads 208 (shown in FIG. 16) and bond pads 68 are coupled to leadframe leads 210 by wirebonds 66. Sixteen leadframe leads 210, sixteen wirebonds 66, and sixteen bond pads 68 have been shown and described with reference to FIG. 17, however it should be understood that the number of leadframe leads 210, wirebonds 66, and bond pads 68 is not a limitation of the present invention. Although a single semiconductor die 58 has been described as being attached to semiconductor component section 206 of leadframe 212, this is not a limitation of the present invention. The leadframe may be configured so that a plurality of semiconductor dice may be attached to a semiconductor die attach area or one or more semiconductor die and one or more passive circuit elements may be attached to a semiconductor die attach area. Alternatively, the semiconductor die attach area may be used as a passive circuit attachment region.

Figure 18:
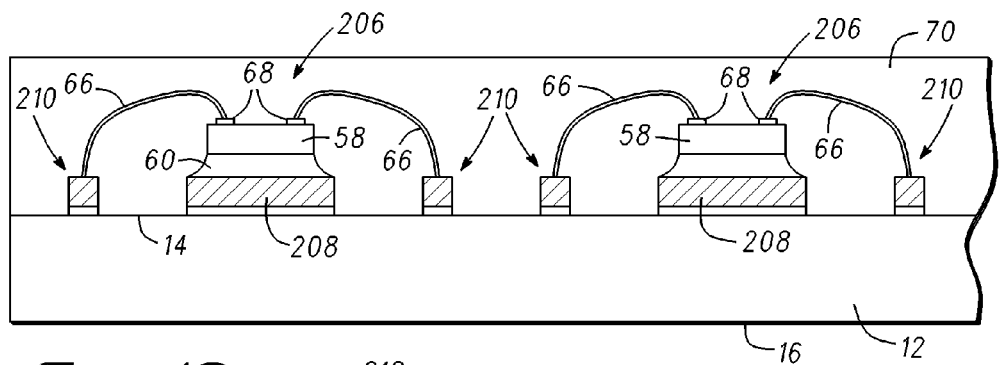
FIG. 18 is a cross-sectional view of a leadframe assembly that includes the leadframe of FIG. 16 at a later stage of manufacture.

FIG. 18 is a cross-sectional view of leadframe 212 taken along section line 18-18 of FIG. 17 after a mold compound 70 has been formed on leadframe 212, semiconductor die 58, wirebonds 66, and leadframe leads 210 to form a leadframe assembly 218. FIG. 18 illustrates semiconductor dice 58 coupled to electrically conductive die attach pads 208 via a die attach material 60 and wirebonds 66 connecting bond pads 68 to corresponding leadframe leads 210. Leadframe 212 is placed in a mold die (not shown) and a mold compound is injected into the mold die to form an encapsulant 70 over semiconductor dice 58, wirebonds 66, electrically conductive die attach pads 208, and leadframe leads 210 to form a leadframe assembly 218. Mold compound 70 protects semiconductor dice 58, wirebonds 66, electrically conductive die attach pads 208, and leadframe leads 210 from physical and environmental stresses. Non-metallic support structure 12 is removed from electrically conductive die attach pads 208, leadframe leads 210, and mold compound 70.

Figure 19:
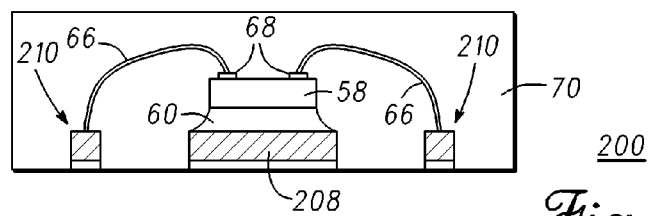
FIG. 19 is a cross-sectional view of a singulated semiconductor component of FIG. 18 at a later stage of manufacture.

Referring now to FIG. 19, non-metallic support structure 12 is removed from leadframe assembly 218 and the remaining portion of leadframe assembly is singulated to form a plurality of semiconductor components 200.

By now it should be appreciated that a semiconductor component including a leadframe and a method for manufacturing the semiconductor component have been provided. A large portion of the leadframe comprises a non-metallic base structure suitable for use with a variety of packages. An advantage of using the non-metallic base structure is that it is cheaper than using a metallic base structure and because a large portion of the leadframe is discarded, less metal is wasted. Another advantage is that the non-metallic base structure may be reused. In addition, stress issues caused by thermal mismatch are minimized because the amount of leadframe metal is reduced.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for manufacturing a semiconductor component, comprising:
   providing a support structure having a non-metallic base structure and first and second major surfaces;
   forming a water repellant layer on the first major surface, wherein the water repellant layer has a substantially hydrophilic portion and a substantially hydrophobic portion, the substantially hydrophilic portion faces the first major surface and the substantially hydrophobic portion extends away from the first major surface;
   forming a layer of electrically conductive material on the substantially hydrophobic portion of the water repellent layer;
   forming at least one leadframe lead on the layer of electrically conductive material; and
   removing the non-metallic base structure.

2. The method of claim 1, wherein forming the layer of electrically conductive material includes using an electroless plating technique.

3. The method of claim 1, further including forming a film on at least the first major surface, wherein the film has a surface that repels water.

4. The method of claim 1, further including forming a rosin film on at least the first major surface.

5. The method of claim 1, further including coupling a semiconductor chip to the layer of electrically conductive material.

6. The method of claim 1, wherein the non-metallic base structure comprises cellulose.

7. The method of claim 6, wherein the cellulose is paper.

8. The method of claim 1, wherein:
forming a layer of electrically conductive material on the substantially hydrophobic portion of the water repellent layer includes forming a layer of copper on the substantially hydrophobic portion of the water repellent layer and further including:
forming the circuit element attach structure and a plurality of leadframe leads from the layer of copper;
forming a mold compound over the circuit element attach structure and the plurality of leadframe leads; and
removing the layer of copper.

9. The method of claim 8, wherein forming the layer of copper over the first major surface includes forming the layer of copper using electroless plating.

10. The method of claim 8, wherein forming the layer of copper over the first major surface includes laminating the layer of copper over the first major surface.

11. The method of claim 1, further including forming at least one leadframe lead over the layer of electrically conductive material.

12. The method of claim 11, further including forming the at least one leadframe lead using an electroplating technique.

13. The method of claim 11, wherein forming the at least one leadframe lead over the layer of electrically conductive material includes forming the at least one leadframe lead as a two layer structure.

14. The method of claim 13, further including forming a first layer of the at least one leadframe lead from one of gold or nickel and forming the second layer of the at least one leadframe lead from one of silver or nickel.

15. A method for manufacturing a semiconductor component, comprising:
providing a non-metallic base structure having first and second major surfaces;
forming a first layer of material on the first major surface, the first layer of material having a hydrophobic side;
forming a layer of electrically conductive material on the first layer of material formed on the first major surface;
forming a leadframe lead on the layer of electrically conductive material;
coupling a circuit element to a portion of the layer of electrically conductive material;
forming an encapsulant material over the circuit element; and
removing the non-metallic base structure.

16. The method of claim 15, wherein forming the leadframe lead on the layer of electrically conductive material includes:
forming a layer of photoresist on the layer of electrically conductive material, the layer of photoresist having at least one opening;
electroplating the leadframe lead on the portion of the electrically conductive material exposed by the at least one opening.

17. The method of claim 15, wherein forming the electrically conductive material on the layer of material formed on the first major surface comprises:
forming a water repellent layer on the first major surface; and
electrolessly plating the layer of electrically conductive material on the water repellent layer.

18. The method of claim 17, further including forming a circuit element attach structure and a plurality of leadframe leads from the layer of electrically conductive material.

19. The method of claim 17, wherein forming the lead frame lead on the layer of electrically conductive material further includes forming a plurality of leadframe leads on the layer of electrically conductive material.

20. The method of claim 19, further including:
coupling a circuit element to a portion of the first layer of electrically conductive material;
electrically coupling the circuit element to one or more of the plurality of leadframe leads.

21. The method of claim 15, further including forming circuit element attach structure and a plurality of leadframe leads from the layer of electrically conductive material.

22. The method of claim 21, further including:
coupling a circuit element to a portion of the circuit element attach structure; and
electrically coupling the circuit element to one or more of the plurality of leadframe leads.

23. The method of claim 15, wherein forming a first layer of material on the first major surface further includes forming a second layer of material on the second major surface, the second layer having a hydrophobic side.

24. The method of claim 23, wherein removing the non-metallic base structure includes removing the second layer of material and the first layer of electrically conductive material.

* * * * *